United States Patent [19]

Rohulich et al.

[11] Patent Number: 4,797,932
[45] Date of Patent: Jan. 10, 1989

[54] SPEAKER VOLUME CONTROL APPARATUS AND METHOD

[75] Inventors: John J. Rohulich; John B. Keys, both of Cambridge, Ohio

[73] Assignee: NCR Corporation, Dayton, Ohio

[21] Appl. No.: 124,329

[22] Filed: Nov. 23, 1987

[51] Int. Cl.$^4$ .................. H04N 7/04; G01H 1/46; G08B 3/00
[52] U.S. Cl. .................. 381/104; 381/101; 381/109; 84/1.27; 330/279
[58] Field of Search .......... 381/104, 101–103, 381/109; 84/1.19, 1.27; 330/279

[56] References Cited

U.S. PATENT DOCUMENTS

| | | | |
|---|---|---|---|
| 3,386,046 | 5/1968 | Myer | 330/29 |
| 3,541,548 | 11/1970 | Cogar et al. | 340/384 |
| 3,711,783 | 1/1973 | Kelling | 330/86 |
| 3,961,281 | 6/1976 | Wooling, Jr. | 330/129 |
| 4,151,481 | 4/1979 | Funston et al. | 330/279 |
| 4,348,932 | 9/1982 | Kashio | 84/1.19 |
| 4,416,178 | 11/1983 | Ishida | 84/1.27 |
| 4,435,679 | 3/1984 | Bedard et al. | 323/350 |
| 4,449,104 | 5/1984 | Agnor et al. | 330/279 |
| 4,482,888 | 11/1984 | Todaka et al. | 340/384 E |
| 4,506,579 | 3/1985 | Rossum | 84/1.27 |
| 4,677,890 | 7/1987 | Yannes | 84/1.27 |
| 4,694,725 | 9/1987 | Seevers et al. | 84/1.27 |

FOREIGN PATENT DOCUMENTS 1582507 5/1978 United Kingdom .

OTHER PUBLICATIONS

Patents Abstracts of Japan, vol. 8, No. 269 (P-319) (1706), 12-8-84; JP 59-136846.
Patents Abstracts of Japan, vol. 9, No. 23 (E-293) (1746), 1-30-85; JP 59-169213.

Primary Examiner—Jin F. Ng
Assistant Examiner—David H. Kim
Attorney, Agent, or Firm—Wilbert Hawk, Jr.; Albert L. Sessler, Jr.

[57] ABSTRACT

Apparatus and method for establishing and changing the volume level of a tone generator which may be used in connection with auditory feedback in a point of sale terminal or other business machine include a microprocessor having a timer with two settable registers which can be set to establish the duty cycle of a signal, an inverting buffer coupled to the timer output, an integrating circuit to which the signal from the buffer is applied, a transistor driver for a speaker to which the integrated signal is applied, and the speaker, the volume of the tone of which may be changed by altering the relative counts of the two timer registers.

14 Claims, 7 Drawing Sheets

SPEAKER VOLUME CONTROL APPARATUS AND METHOD

BACKGROUND OF THE INVENTION

Auditory feedback for machine operators is widely used in a number of applications in business equipment. For example, electronic keyboards are widely used in modern data processing and similar equipment. Keyboard switches in such keyboards may take the form of two membrane-type members which must make contact with each other to provide a signal indicating that the key position has been actuated. The signal thus generated is normally decoded to generate binary data signals representing the actuated key. Such keyboards are essentially noiseless in operation and thus do not, of themselves, provide the auditory feedback that was present in earlier types of keyboards, such as those employing mechanical keys, to indicate to the user that the key had been depressed a sufficient distance to enter the information desired. In order to provide such auditory feedback, audio generators have been incorporated into keyboards to provide an audible tone representing the click sound which occurs, for example, in a mechanical keyboard upon full key depression. Various means have been employed to change the volume of the audio generator in response to varying noise conditions in the environment in which the apparatus employing the keyboard is used. One such system is shown in U.S. Pat. No. 4,694,725, issued Sept. 22, 1987, inventors Daniel B. Seevers and John J. Rohulich, assigned to the assignee of the present application. Other uses for auditory feedback in business machines include operator alert for price changes, scanner scale operations, check validation and cash drawer opening.

SUMMARY OF THE INVENTION

This invention relates to vo10me control apparatus, and more particularly relates to such a volume control apparatus which is economical and efficient, and in which the volume may be altered by appropriate programming of the microprocessor associated with the volume control apparatus.

In accordance with one embodiment of the invention, speaker volume control apparatus comprises timing means including first and second registers which can be set to digital values representing first and second durations, a counter capable of counting in sequence the values stored in said first and second registers, output means coupled to said counter on which a signal having a waveform representing said stored first and second register values appears, and means for turning said counter on and for turning said counter off at the completion of counting of said first and second registers; buffer inverter means for buffering and inverting the signal appearing on said counter output means; integrating mens including a low-impedance discharge path for integrating the signal appearing on the output of said buffer inverter means; signal translating means coupled to said integrating means for receiving the integrated signal therefrom; a speaker coupled to said signal translating means and capable of producing a tone of varying volume in response to a signal of varying strength which is applied thereto; and means for applying an integated signal from said integrating means to said speaker.

In accordance with a second embodiment of the invention, a method for controlling the volume of a speaker comprises the following steps: setting the maximum count of first and second registers in a timer; applying counting pulses to a counter which is controlled by first one and then the other of said registers to provide a repeating pulsed output signal from said timer having a first pulse width at one logic level representing the value stored in said one of said registers and a second pulse width at a second logic level representing the value stored in said other of said registers; controlling the commencement and termination of operation of the counter to control said output signal; buffering and inverting said output signal from said timer; integrating the buffered and inverted signal; applying said integrated signal to a signal translating device to control the on and off states of said signal translating device; and applying an output of said signal translating device to a speaker to control the volume of a tone produced by said speaker.

It is accordingly an object of the present invention to provide a simple, inexpensive and effective speaker volume control apparatus.

Another object is to provide speaker volume control apparatus in which speaker volume is controlled by the contents of two registers in a timer which provides a pulse signal to an integrating circuit, the output of which is applied to the speaker.

Another object is to provide speaker volume control apparatus in which the volume can be changed by programmed alteration of counts stored in registers of a timer.

Another object is to provide volume control of a speaker by means of timer pulse width control.

Another object is to provide a simple, inexpensive and effective method for controlling the volume of a speaker.

With these and other objects, which will become apparent from the following description, in view, the invention includes certain novel features of construction and combinations of parts, a preferred form or embodiment of which is hereinafter described with reference to the drawin9s which accompany and form a part of this specification.

DETAILED DESCRIPTION

Figure 1:
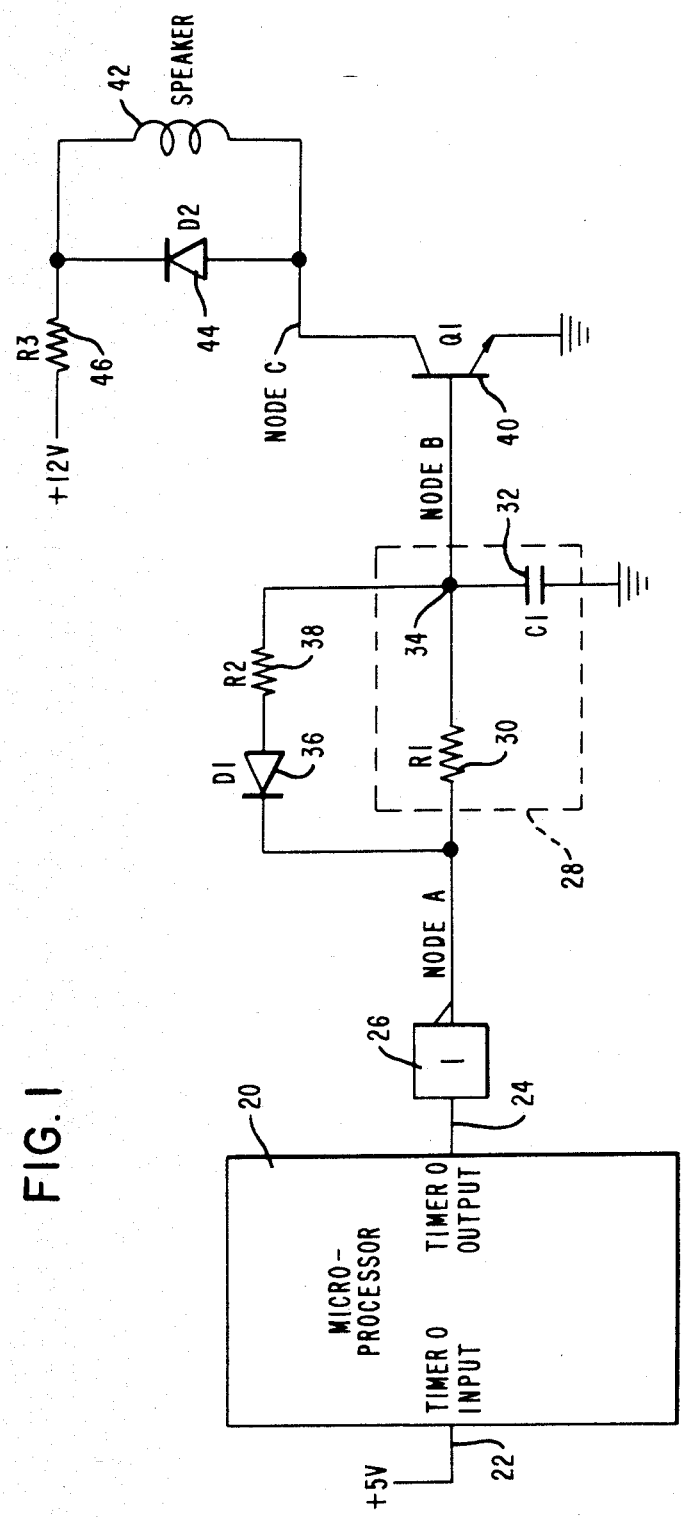
FIG. 1 is a circuit diagram showing the speaker, the microprocessor which controls the volume of the speaker, and the circuit elements coupling the two.

Referring now to FIG. 1, a microprocessor 20 shown there in block form is provided with a timer input of +5 volts on input 22. An output 24 from the timer of the microprocessor 20 is applied to an inverting buffer 26, which may be of type 74ALS04. The output of the buffer 26 is connected at node A to one end of a resistor 30. The buffer 26 inverts the signal on the output 24 and also assures that adequate source and sink current is available to the integration circuitry represented by dashed block 28 which includes the 3300-ohm resistor 30 and a 0.22-microfarad capacitor 32 which is connected between a node 34 at one end of the resistor 30 and ground. A series-connected combination of a diode 36, which may be of type IN902, and a 10-ohm resistor 38 are connected in parallel with the resistor 30 between the other end of the resistor 30 and the node 34. The node 34 is also connected to the base of a transistor 40 which may be of the Darlington type. A Darlington type transistor is used because it is a power transistor, it is capable of providing high gain, and it has a relatively high base-emitter voltage which allows operation over a relatively linear portion of the output waveform of the integration circuitry 28. The diode 36 and the resistor 38 provide a low-impedance discharge path for discharging capacitor 32, and thus insure that during operation, the base of the transistor 40 is adequately turned off in time for the next turn-on pulse.

The transistor 40 has its emitter connected to a base reference potential, shown as ground, and its collector connected to one terminal of a speaker 42 and to the anode of diode 44 which is connected in parallel with the speaker 42. The other terminal of the speaker 42 and the cathode of the diode 44 are connected together, and to a source of +12 volts potential through a 36-ohm, one watt resistor 46. The resistor 46 is the current limiting resistor for the speaker 42 and determines the high end of the volume control range. The diode 44 is used to protect the transistor 40 from the inductive kick of the speaker 42. The illustrated circuit is optimized for a speaker with a 22-ohm impedance at a frequency of 1 kilohertz.

Figure 2B:
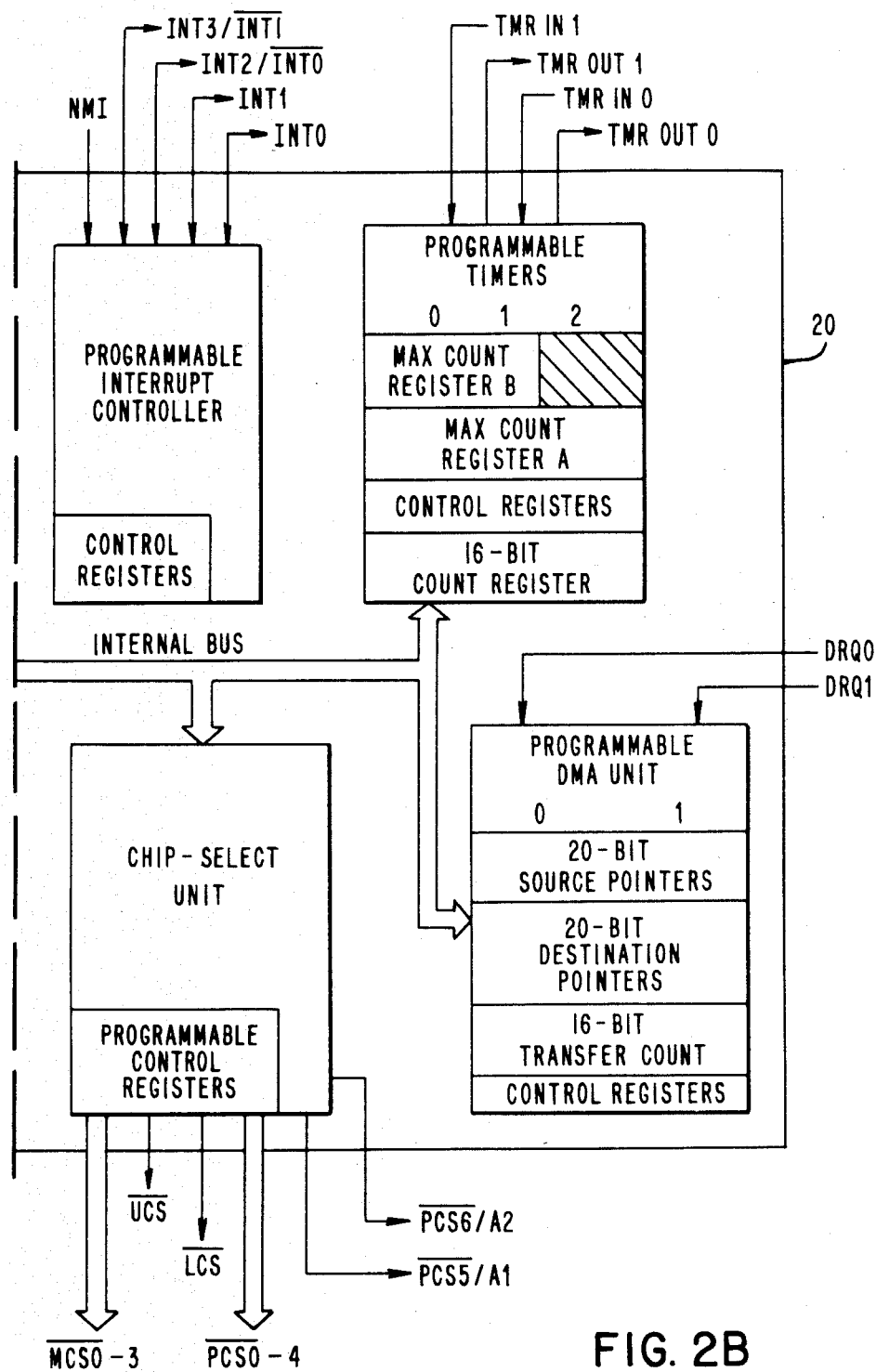
FIGS. 2A and 2B, taken together, constitute a block diagram of a microprocessor which may be used in the present invention.
Figure 3:
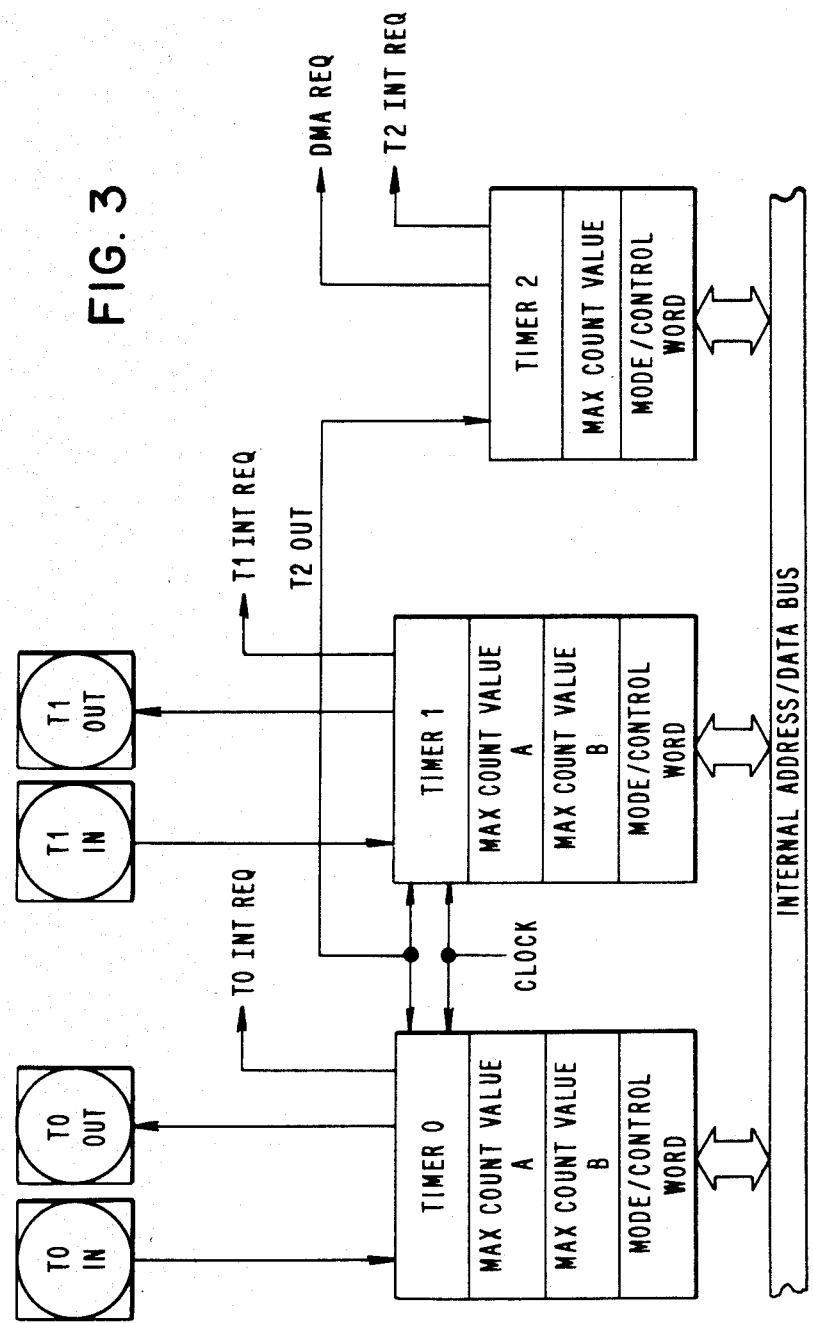
FIG. 3 is a more detailed block diagram of a timer which forms part of the microprocessor of FIG. 2.
Figure 2A:
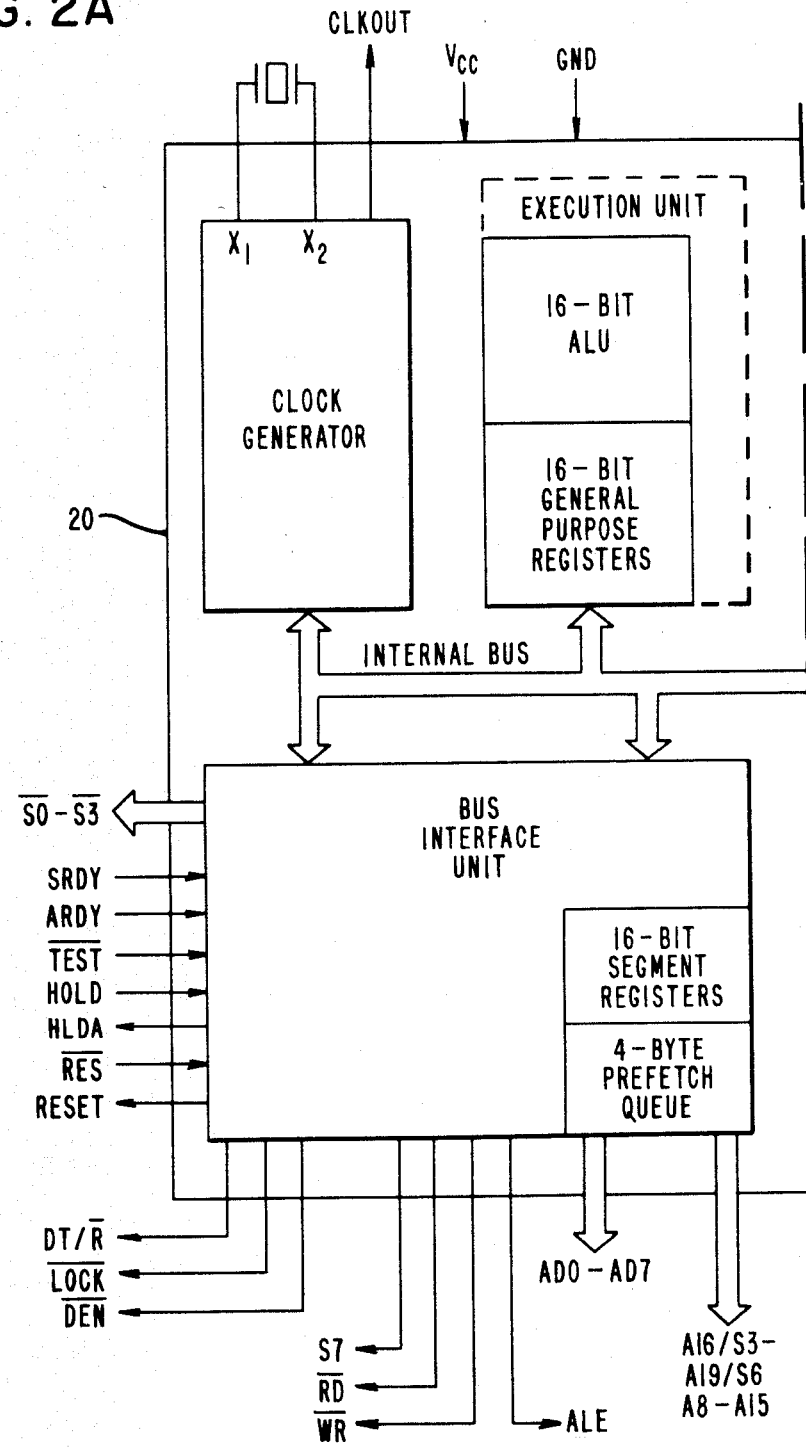

In the illustrated embodiment, the microprocessor 20 is an important element in a business machine such as, for example, a point of sale terminal, and is employed for a number of other purposes in addition to being included in the speaker volume control apparatus. The microprocessor 20 may be of type 80188, manufactured by Intel Corporation, Santa Clara, Calif. It is shown in block form in FIG. 2, and contains several integrated system components, including three internal programmable 16-bit timers, two of which are highly flexible. A block diagram of the timer portion of the microprocessor 20 is shown in FIG. 3, and is seen to include three timers: Timer 0, Timer 1 and Timer 2. The turning on and off of the tone emitted by the speaker 42, as well as variation in the volume of the tone, are controlled by the Timer 0. The availability of Timer 0 for use for speaker volume control makes it possible to incorporate the apparatus of the present invention into a point of sale terminal or other business machine with minimum additional expense.

The volume of the speaker 42 is controlled in the present invention by integrating the output of Timer 0, taken from the timer output pin of the microprocessor 20, to drive said speaker. The output signal from Timer 0 in the microprocessor 20 is buffered and inverted by the inverting buffer 26, integrated by the integration circuitry 28 and applied to the base of the transistor 40, which transistor controls the volume of the speaker 42. The integration circuitry 28 enables a smoother, more uniform volume control to be obtained. This type of volume control can be implemented only when a single fixed frequency or a narrow frequency range is to be controlled, since the duty cycle of the resultant speaker drive waveform is a function of the pulse width and frequency generated by the Timer 0 and passed through the integration circuitry 28. The relative length of time that the transistor 40 is conducting during a given pulse determines the power which is applied to the speaker and thus the volume of the tone emitted.

The three timers, Timer 0, Timer 1 and Timer 2, are controlled by eleven 16-bit registers: count register, MAX COUNT register A, MAX COUNT register B, and mode/control register. Timer 2 does not contain a MAX COUNT register B. The count register contains the current value of the counter. The value of the count register is incremented for each timer event. Each timer has a MAX COUNT register, which determines the maximum count that the timer will reach. Timers 0 and 1 also have a second MAX COUNT register, which allows these timers to alternate their count between the two different MAX COUNT values. In the dual MAX COUNT register mode, the timer output pin will indicate which MAX COUNT register is currently in use. This permits the varying of waveform duty cycles. The timers operate at one-fourth the 80188 CPU clock rate, so that an 8 MHz CPU clock speed yields a 2 MHz timer count rate.

The mode/control register allows the programming of the timer mode of operation. The bit assignments for the timer mode/control register and the bit setting for tone volume control use are as follows:

TABLE 1

| Bit | 15 | 14 | 13 | 12 | 11 | ... | 5 | 4 | 3 | 2 | 1 | 0 |
|---|---|---|---|---|---|---|---|---|---|---|---|---|
| MNEMONIC | EN | INH/ | INT | RIU | 0 | ... | MC | RTG | P | EXT | ALT | CONT |
| TONE ON | 1 | 1 | 0 | 0 | 0 | ... | 0 | 0 | 0 | 0 | 1 | 1 |
| TONE OFF | 1 | 1 | 0 | 0 | 0 | ... | 0 | 0 | 0 | 0 | 1 | 0 |

The functions of the various bits, as identified in the "MNEMONIC" line above, are set forth below.

The ALT bit determines which of the two MAX COUNT registers is used for count comparison. If ALT=0, register A is always used. If ALT=1, the comparison will alternate between register A and B. The ALT bit also determines the function of the timer output pin. If ALT=0, the output pin will go low for one clock after the maximum count is reached. If ALT=1, the output pin will reflect the current MAX COUNT register being used. A logic level 0 on the output pin designates that the current register is the B register, while a logic level 1 on the output pin designates that the current register is the A register.

Setting the CONT bit=1 causes the associated timer to run continuously, while setting the CONT bit=0 causes the timer to stop on the maximum count. If CONT=0 and ALT=1, the timer will count to the MAX COUNT in register A, reset, count to the register B value, reset and stop.

The external bit EXT selects between internal and external clocking of the timer. If EXT=1, the timer will count low to high transitions on the input pin. If EXT=0, the timer will count an internal clock using the input pin as a control function defined by the RTG bit.

The prescaler bit P is used only if EXT=0. If the P-bit=0, the timer will count at one-fourth the internal CPU clock rate. If the P-bit=1, the output of Timer 2 will be used as a clock for the timer.

The retrigger bit RTG is used only if EXT=0. If RTG=0, the input gates the internal clock on and off. If RTG=1, the input pin detects low to high transitions. The first transition starts the timer running, clearing the timer value to 0 on the first clock, and incrementing thereafter. If CONT=0, when the timer has reached maximum count, the EN bit will be cleared.

Setting the EN bit=1 enables the timer to run. Setting the EN bit=0 inhibits the timer from counting.

If the INH/bit=1 during a write to the mode/control word, then the state of the EN bit will be modified by the write. If the INH/bit=0 during a write to the mode/control word, then the EN bit will not be affected by the write.

If the INT bit=1, interrupts from the timer are enabled. If the INT bit=0, interrupts from the timer are disabled.

The maximum count bit MC is set whenever the timer reaches its maximum count value.

The register in use bit RIU indicates which MAX COUNT register is currently being used. RIU=0 indicates that register A is in use. RIU=1 indicates that register B is in use.

As previously mentioned, the tone on/off and the tone volume are controlled by use of Timer 0 in the microprocessor 20. Timer 0 should be set to run in the DUAL MAX COUNT REGISTER MODE, with the ALT bit=1. The basic tone frequency may suitably be set to 1.25 KHz (800 microseconds), which is accomplished by loading the Timer 0 count A and B registers to the appropriate values.

The tone circuitry is driven by the timer output pin. When Timer 0 count register A is active, the waveform on output 24 is at a high logic level and the speaker driver circuitry is in the "off" state. When Timer 0 register B is active, the waveform on output 24 is at a low logic level and the speaker driver circuitry is in the "on" state. The on/off control of the speaker is via Timer 0 control bits. When the tone is turned off, the current register selected must be register A. This is accomplished by manipulating the CONT timer control bit. Stopping the speaker tone via the CONT timer control bit insures that the counter will continue to complete the current count sequence. This will insure that the speaker drive transistor 40 is in the "off" state when the tone is off.

The volume is controlled by the duty cycle of the tone frequency. If register A is set to 63F HEX (hexadecimal number system) and register B is set to 1 HEX, the output volume will be at the minimum value (approximately 0% duty cycle). If register A is set to 320 HEX and register B is set to 320 HEX, the volume will be at its maximum level (50% timer output duty cycle). It is recommended that the range of volume be spread out over the 25% to 50% duty cycle range. The following formula may be used to calculate register values:

$$\frac{\text{Register } B}{\text{Register } A + \text{Register } B} \times 100 = \text{duty cycle (\%)}$$

In order to obtain a frequency of 1.25 KHz, the following formula should be used:

Register A + Register B = 640 HEX

The following register values produce the corresponding timer output duty cycles:

TABLE 2

| 80188 Count Register A | 80188 Count Register B | Timer 0 Output Duty Cycle |
| --- | --- | --- |
| 63F HEX | 1 HEX | 0% |
| 4B0 HEX | 190 HEX | 25% |
| 460 HEX | 1E0 HEX | 30% |
| 450 HEX | 1F0 HEX | 31% |
| 440 HEX | 200 HEX | 32% |
| 430 HEX | 210 HEX | 33% |
| 420 HEX | 220 HEX | 34% |
| 410 HEX | 230 HEX | 35% |
| 400 HEX | 240 HEX | 36% |
| 3E0 HEX | 260 HEX | 38% |
| 3C0 HEX | 280 HEX | 40% |
| 3A0 HEX | 2A0 HEX | 42% |
| 380 HEX | 2C0 HEX | 44% |
| 360 HEX | 2E0 HEX | 46% |
| 340 HEX | 300 HEX | 48% |
| 320 HEX | 320 HEX | 50% |

The numerical maximum count values to which register A and register B are set are entered into the microprocessor 20 and thence conveyed to the Timer 0 by conventional means, such as a program which is entered into the point of sale terminal or other business machine which contains the microprocessor 20. The volume of the tone emanating from the speaker 42 can then be altered as may be subsequently required by a change in the external environment or for some other reason by changing the maximum count values for register A and register B by a change in the program entered into the point of sale terminal or other business machine, or by some other suitable means.

Figure 6:
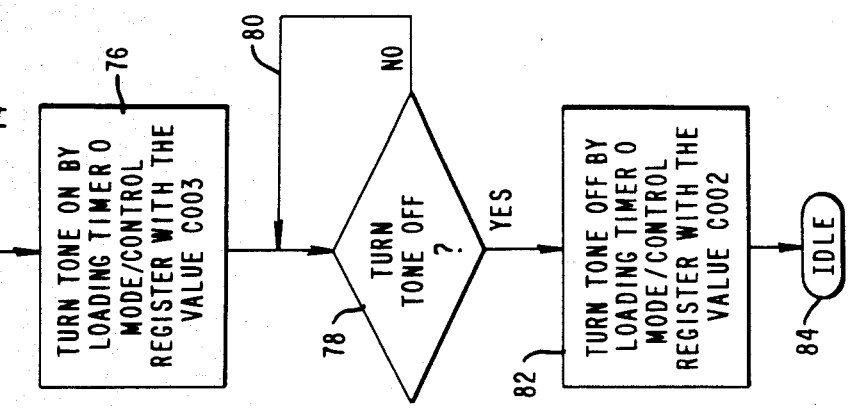
FIG. 6 is a flow diagram of the sound tone process for the speaker volume control apparatus.
Figure 5:
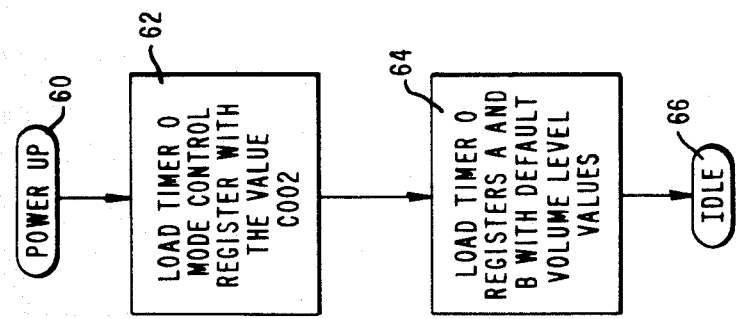
FIG. 5 is a flow diagram of the change volume setting process for the speaker volume control apparatus.
Figure 4:
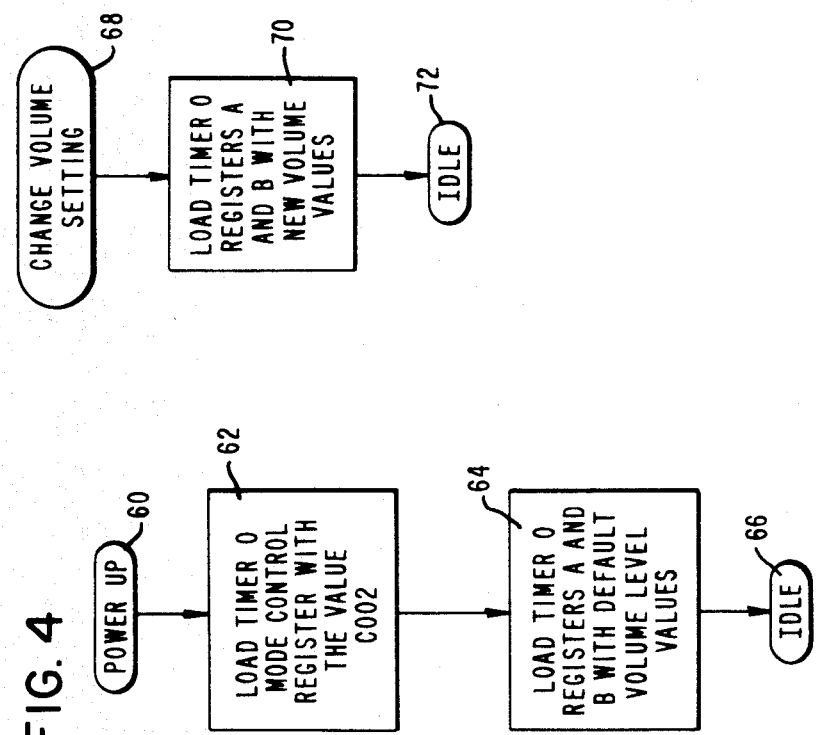
FIG. 4 is a flow diagram of the power up process for the; speaker volume control apparatus.

Referring now to the flow diagrams of FIGS. 4, 5 and 6, these diagrams show three processes involved in the practice of the present invention.

FIG. 4 shows a power-up sequence, commencing with block 60. As represented in block 62, the mode/control register of Timer 0 is loaded with the hexadecimal value C002, corresponding to the "tone off" setting given in Table 1 of the specification. Following that, as represented in block 64, registers A and B are loaded with predetermined initial or "default" values to provide a predetermined duty cycle, and thus a predetermined tone volume, for the speaker 42. The sequence then goes to an idle state, as represented by block 66, and the system is ready for its initial operation.

FIG. 5 shows a sequence in which the volume setting of the speaker 42 is changed. This sequence commences with block 68, and continues to block 70, in which registers A and B of the Timer 0 are loaded with new volume values to provide a new duty cycle, and thus a new tone volume, for the speaker 42. The sequence then goes to an idle state, as represented by block 72, and the system is ready for continued operation, employing the new speaker volume.

FIG. 6 shows the sequence for sounding the tone at the prescribed volume, commencing with block 74. As represented in block 76, the speaker 42 is energized to produce a tone by loading the mode/control register of Timer 0 with the hexadecimal value C003, corresponding to the "tone on" setting given in Table 1 of the specification. The "tone off" value C002 is changed to the "tone on" value C003 by altering the CONT bit, under control of depression of a key of the keyboard of the machine in which the speaker volume control apparatus of the present invention is employed, or by some other means, as determined by the manufacturer or user of the system. The sequence then proceeds to a decision block 78, in which a determination is made as to whether or not the tone is to be turned off. If not, the process loops over path 80 and continues to do so for as long as it is desired to continue the tone. When the tone is to be turned off, as by termination of key depression on the keyboard, the process continues over the "yes" branch of block 78 to block 82, in which the tone is turned off by loading the mode/control register of Timer 0 with the hexadecimal value C002, by once again altering the CONT bit. As was previously mentioned, when the CONT bit is set to 0, the Timer 0 will count to the MAX COUNT in register A, reset, count to the MAX COUNT in register B, reset and stop, thus terminating the tone. The sequence then goes to an idle state, as represented by block 84, and the system may continue in operation.

Figure 7:
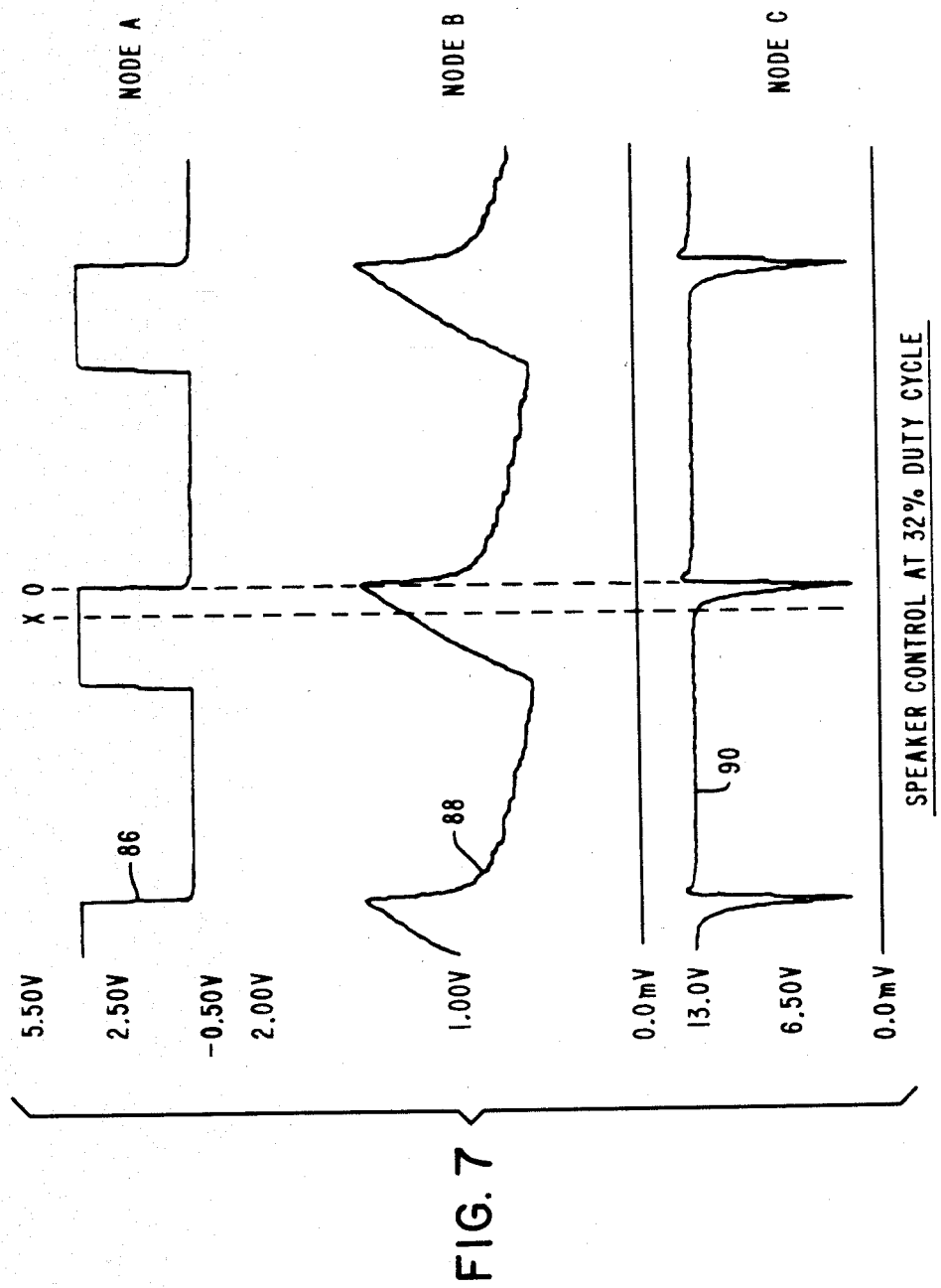
FIG. 7 is a diagram showing waveforms generated when the speaker volume control apparatus is set for a 32% duty cycle.
Figure 8:
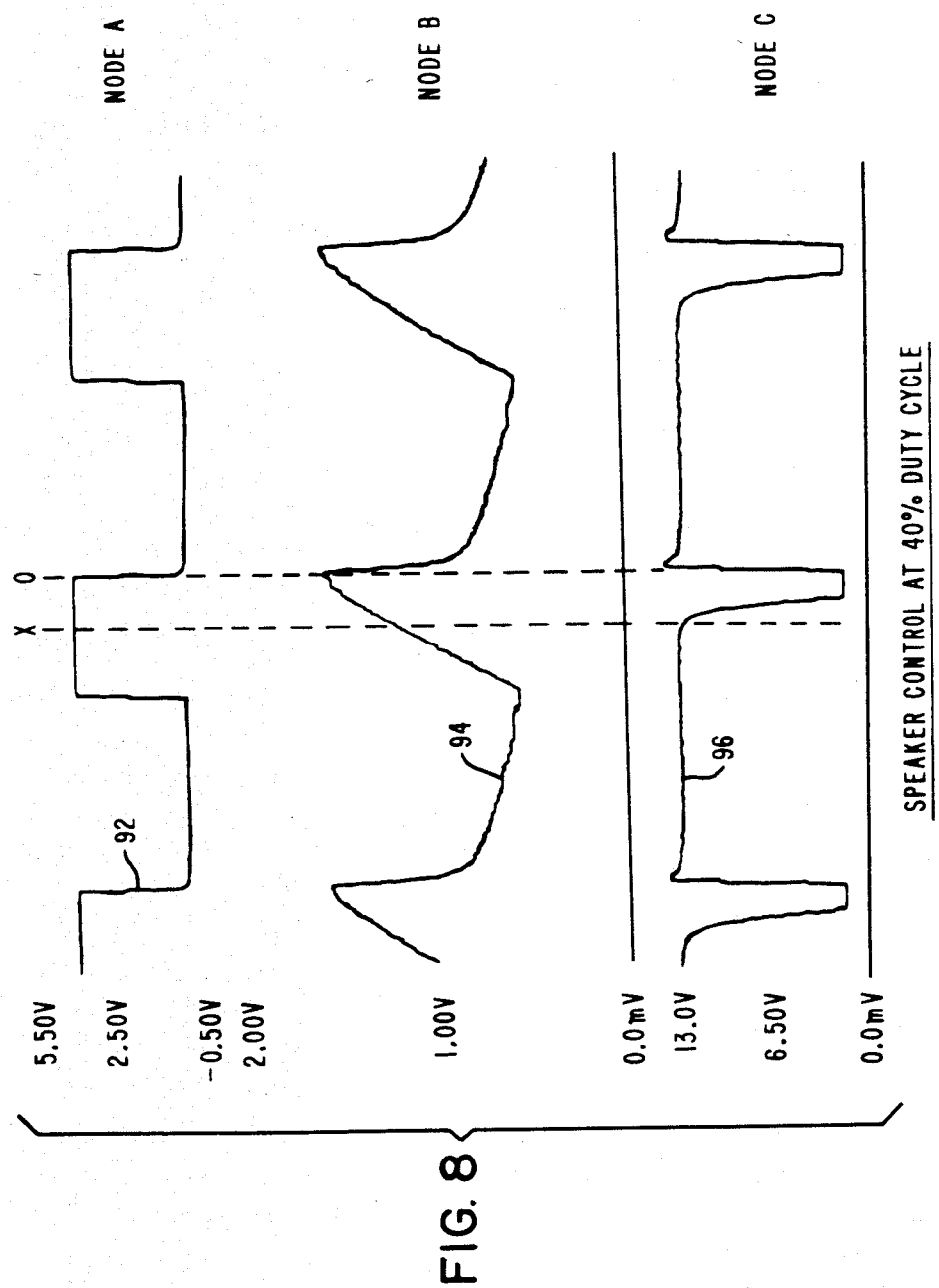
FIG. 8 is a diagram showing waveforms generated when the speaker volume control apparatus is set for a 40% duty cycle.

Shown in FIGS. 7 and 8 are two series of waveforms, representing system operation with different combinations of values loaded into registers A and B of Timer 0, and thus different duty cycles of the speaker 42. In FIG. 7, the waveforms for a 32% duty cycle are shown. Reference to Table 2 of the specification shows that such a duty cycle may be achieved using values of 440 HEX and 200 HEX, respectively, in registers A and B. In FIG. 8, the waveforms for a 40% duty cycle are shown. Reference to Table 2 shows that such a duty cycle may be achieved using values of 3C0 HEX and 280 HEX, respectively, in registers A and B.

In FIG. 7, the waveform 86 is taken at the output of the buffer 26 at node A; the waveform 88 is taken at the output of the integration circuitry 28 at node B; and the waveform 90 is taken at the collector of the transistor 40 at node C. Similarly, in FIG. 8, the waveform 92 is taken at the output of the buffer 26 at node A; the waveform 94 is taken at the output of the integration circuit 28 at node B; and the waveform 96 is taken at the collector of the transistor 40 at node C.

In both FIG. 7 and FIG. 8, the distance between vertical lines X and 0 in the third waveform (90 in FIG. 7 and 96 in FIG. 8) represents the "on" time of the transistor 40 of FIG. 1. In FIG. 7, it will be seen that this "on" time is very short and that the transistor 40 does not reach saturation. In FIG. 8, on the other hand, with a larger duty cycle, the transistor 40 is on for a longer time and reaches saturation, thus providing greater power and a greater volume of the tone from the speaker 42.

While the form of the invention shown and described herein is admirably adapted to fulfill the objects primarily stated, it is to be understood that it is not intended to confine the invention to the form or embodiment disclosed herein, for it is susceptible of embodiment in various other forms within the scope of the appended claims.

What is claimed is:

1. Speaker volume control apparatus comprising:
   timing means including first and second registers which can be set to digital values representing first and second durations, a counter capable of counting in sequence the values stored in said first and second registers, output means coupled to said counter on which a signal having a waveform representing said stored first and second register values appears, and means for turning said counter on and for turning said counter off at the completion of counting of said first and second registers;
   buffer inverter means for buffering and inverting the signal appearing on said counter output means;
   integrating means including a low impedance discharge path for integrating the signal appearing on the output of said buffer inverter means;
   signal translating means coupled to said integrating means for receiving the integrated signal therefrom;
   a speaker coupled to said signal translating means and capable of producing a tone of varying volume in response to a signal of varying strength which is applied thereto; and
   means for applying an integrated signal from said integrating means to said speaker.

2. The speaker of claim 1 in which the volume of the speaker can be increased by increasing the digital value stored in one of said registers with respect to the value stored in the other of said registers.

3. The apparatus of claim 1 in which said timing means is part of a microprocessor.

4. The apparatus of claim 1 in which the signal translating means comprises a Darlington device.

5. The apparatus of claim 1 in which the value stored in said first register represents the duration of a positive logic level, and the value stored in said second register represents the duration of a negative logic level, in a waveform having a total period represented by the combined values stored in said first and second registers.

6. The apparatus of claim 1 in which the duty cycle of the waveform can be altered by altering the relative values of the first and second registers in the timing means.

7. The apparatus of claim 6 in which the duty cycle of the waveform varies between 25% and 50%.

8. The apparatus of claim 6 in which altering of the relative values of the first and second registers may be accomplished by programming of the apparatus.

9. A method for controlling the volume of a speaker comprising the following steps:
   setting the maximum counts of first and second registers in a timer;
   applying counting pulses to a counter which is controlled by first one and then the other of said registers to provide a repeating pulsed output signal from said timer having a first pulse width at one logic level representing the value stored in said one of said registers and a second pulse width at a second logic level representing the value stored in said other of said registers;
   controlling the commencement and termination of operation of the counter to control said output signal;
   buffering and inverting said output signal from said timer;
   integrating the buffered and inverted signal;
   applying said integrated signal to a signal translating device to control the on and off states of said signal translating device; and applying an output of said signal translating device to a speaker to control the volume of a tone produced by said speaker.

10. The method of claim 9, also including the step of changing the maximum counts of said first and second registers of said timer to produce a different relative timing of pulse widths of the two logic levels of the repeating pulsed output signal, thereby changing the relative on and off states of said signal translating device and the volume of the tone produced by said speaker.

11. The method of claim 9 in which the timer is contained in a microprocessor.

12. The method of claim 9 in which the signal translating device comprises a Darlington device.

13. The method of claim 9 in which the pulse widths of the two logic levels of the repeating pulsed output signal produce a waveform duty cycle of between 25% and 50%.

14. The method of claim 9 in which the commencement and termination of operation of the registers is controlled by the setting of a mode/control register in said timer.

* * * * *